United States Patent
Lin et al.

(10) Patent No.: US 6,524,913 B1
(45) Date of Patent: Feb. 25, 2003

(54) METHOD OF FABRICATING A NON-VOLATILE MEMORY WITH A SPACER

(75) Inventors: Hung-Sui Lin, Hsin-Ying (TW); Han-Chao Lai, Taichung (TW); Tao-Cheng Lu, Kaoshiung (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/004,934

(22) Filed: Dec. 4, 2001

(30) Foreign Application Priority Data

Nov. 16, 2001 (TW) ........................... 90128446 A

(51) Int. Cl.[7] ........................... H01L 21/8247
(52) U.S. Cl. ............... 438/261; 438/287; 438/595
(58) Field of Search ...................... 438/216, 261, 438/262, 287, 591, 595, 954

(56) References Cited

U.S. PATENT DOCUMENTS 6,458,661 B1 * 10/2002 Sung ........................ 438/595
6,465,303 B1 * 10/2002 Ramsbey et al. ........... 438/257
2002/0086548 A1 * 7/2002 Chang ........................ 438/724

* cited by examiner

*Primary Examiner*—Chandra Chaudhari
(74) *Attorney, Agent, or Firm*—J. C. Patents

(57) ABSTRACT

A method of fabricating a non-volatile memory, in which a charge-trapping layer consisting of insulating materials and bar-like conductive layers to be patterned into the gates are formed at first. The buried bit-lines are formed in the substrate between the bar-like conductive layers. Each of the buried bit-lines extends into the substrate under a portion of an adjacent high-K spacer, but not to the substrate under an adjacent bar-like conductive layer. High-K spacers are formed on the side-walls of the bar-like conductive layers. Then the bar-like conductive layers are patterned into the gates, and word-lines are formed on the substrate to electrically connect with the gates. The material of the high-K spacer has a dielectric constant and the high-K spacer has a width, such that a channel will extend to the substrate under the high-K spacer and connect with the buried bit-line when the non-volatile memory is operated.

20 Claims, 3 Drawing Sheets

METHOD OF FABRICATING A NON-VOLATILE MEMORY WITH A SPACER

CROSS-REFERENCE TO RELATED APPLICATION

This application claims the priority benefit of Taiwan application serial no. 90128446, filed Nov. 16, 2001.

BACKGROUND OF THE INVENTION

1. Field of Invention

The present invention relates to a method of fabricating a semiconductor device. More particularly, the present invention relates to a method of fabricating a non-volatile memory.

2. Description of Related Art

A non-volatile memory is capable of retaining stored data even if the power is turned off and has the advantages of being light in weight and minute in dimension, therefore its use is becoming more and more widespread. The early non-volatile memory used the polysilicon floating gate as the storage unit, in which only one bit can be stored since polysilicon is a conductive material and the charges stored will delocalize into the whole floating gate. Recently, non-volatile memory having a nitride layer as a charge storage layer, such as NROM (nitride ROM) or SONOS (Substrate-Oxide-Nitride-Oxide-Silicon) memory, has been proposed. Since the insulating nitride layer is used as the charge storage layer in such a memory, the charges trapped in the charge storage layer will not delocalize, thereby each memory cell can have two bits stored.

Refer to FIG. 1, which illustrates the structure of the conventional SONOS memory cell and the positions of the data storage regions in the SONOS memory cell. As shown in FIG. 1, the conventional SONOS memory cell includes a substrate 100, a silicon oxide layer 110, a silicon nitride layer 120, a silicon oxide layer 130, a polysilicon gate 140, and two doped regions 150 & 160 that are located in the substrate 100 beside the polysilicon gate 140 and serve as a source region and a drain region. The silicon oxide layer 110, the silicon nitride layer 120, and the silicon oxide layer 130 together are called a charge-trapping layer 138. Two data storage regions 170 and 180 are located at two ends of the silicon nitride layer 120 under the polysilicon gate 140 in this memory cell.

If one intends to write one bit into the data storage region 170, it is needed to let the charges flow from the doped region 160 to the doped region 150. Thus, the charges will flow toward the polysilicon gate 140 in the vicinity of the doped region 150, where the electric field is strongest, and will be trapped in the data storage region 170. On the other hand, when one wants to write one bit into the data storage region 180, the direction of the charge current is reversed. Since the insulating nitride layer is used as the charge-trapping layer in such a memory, the charges trapped in the charge-trapping layer will not delocalize, thereby each memory cell can have two bits stored and each bit can be erased individually.

Although the data storage regions 170 and 180 can be programmed or erased respectively in the conventional SONOS memory cell, the charges previously stored in one of the data storage regions 170 (180) will interfere with the operation of the other. Moreover, when the dimension of the memory cell or gate linewidth is reduced, the distance between the two data storage regions 170 and 180 will decrease and the interference between them becomes even more severe. In other words, it is difficult to scale down the conventional SONOS memory cell because of the interference.

SUMMARY OF THE INVENTION

Accordingly, a method of fabricating a non-volatile memory is provided in this invention, by which the distance between the two data storage regions can be increased to decrease the interference between them under the same dimension of the memory cell.

Another object of this invention is to increase the distance between the two data storage regions in the charge-trapping layer of the non-volatile memory, so as to facilitate the miniaturization of the memory cell or the gate linewidth.

In the method of fabricating a non-volatile memory of this invention, an insulating charge-trapping layer and a plurality of bar-like conductive layers are formed on the substrate, wherein the bar-like conductive layers are to be patterned into many gates. After that, buried bit-lines are formed in the substrate between the bar-like conductive layers. Each of the buried bit-lines extends into the substrate under a portion of an adjacent high-K spacer, but not to the substrate under an adjacent bar-like conductive layer. An annealing is optionally performed. Spacers of a high-K material (high dielectric material) are then formed on the side-walls of the bar-like conductive layers. The bar-like conductive layers are afterward patterned into many gates. Subsequently, word-lines are formed over the substrate to electrically connect with the gates. The material of the high-K spacer has a dielectric constant and the high-K spacer has a width, such that a channel will extend to the substrate under the high-K spacer and connect with the buried bit-line when the non-volatile memory is operated.

Since there is a high-K spacer formed on the side-wall of the gate in this invention, the channel can extend to the substrate under the high-K spacer and connect with the adjacent buried bit-line when a voltage is applied to the gate. Thus, the charges moving in the channel can be injected into the charge-trapping layer near the buried bit-line, where the electric field is strongest. That is, the charges are stored in the data storage region within the charge-trapping layer under the high-K spacer. Thus, the distance between the two data storage regions in the charge-trapping layer increases, and the interference between them decreases. Moreover, since the distance between the two data storage regions can be increased by the method of this invention, a smaller memory cell is also feasible, i.e., it is easier to scale down the size of the memory cell (gate linewidth).

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

The method of fabricating a SONOS memory is taken as an example in this preferred embodiment to explain the fabrication of a non-volatile memory of this invention with the accompanying drawings FIGS. 2A~2E.

Figure 2A:
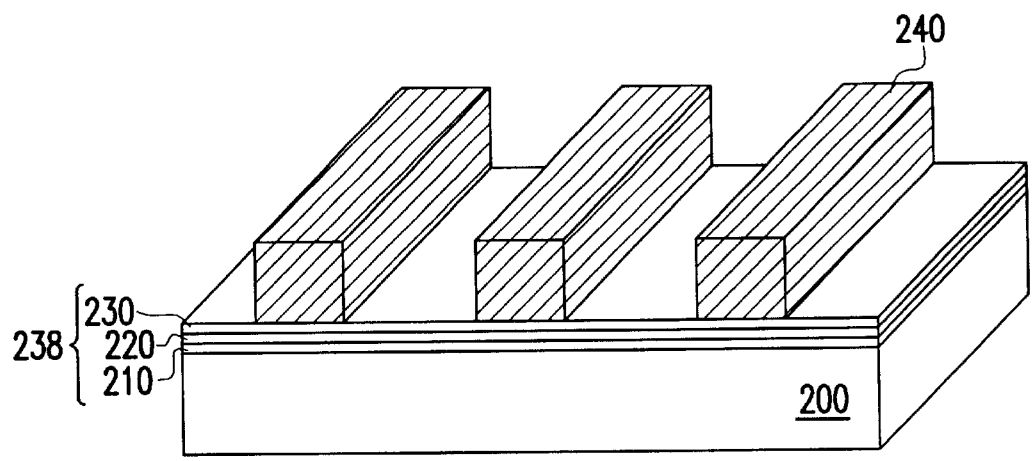
FIGS. 2A~2E are perspective drawings showing a flow chart of the method of fabricating a SONOS memory according to one preferred embodiment of this invention.

Referring to FIG. 2A, a substrate 200 is provided, then a silicon oxide layer 210, a silicon nitride layer 220, and a silicon oxide layer 230 are sequentially formed on the substrate 200 to construct a charge-trapping structure 238. The silicon oxide layer 210 is preferably formed by thermal oxidation, the silicon nitride layer 220 is formed by, for example, low pressure chemical vapor deposition (LPCVD), and the silicon oxide layer 230 may be formed by oxidizing the surface of the silicon nitride layer 220. Afterward, a plurality of parallel bar-like conductive layers 240, which are to be patterned into many gates, are formed over the substrate 200, wherein the material of the bar-like conductive layers 240 is, for example, polysilicon or polycide.

Figure 2B:
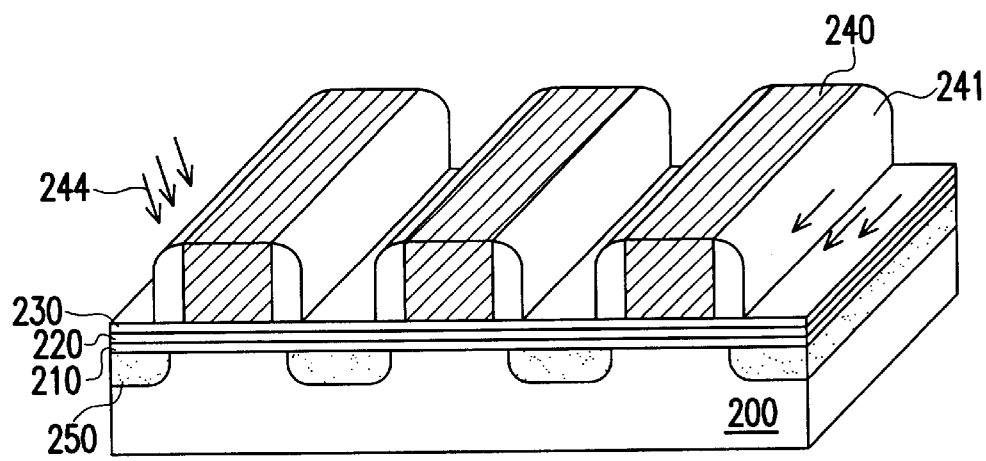

Referring to FIG. 2B, a plurality of sacrificial spacers 241, which may be silicon oxide spacers, are formed on the side-walls of the bar-like conductive layers 240, then a tilt ion implantation 244 is performed to create buried bit-lines 250 in the substrate 200 between the bar-like conductive layers 240. Since the tilt ion implantation 244 is used here, the buried bit-line 250 extends to the substrate 200 under a portion of an adjacent sacrificial spacer 241, but not to the substrate 200 under an adjacent bar-like conductive layer 240. Then, an annealing is performed to repair the damaged lattice structure in the substrate 200.

Figure 2C:
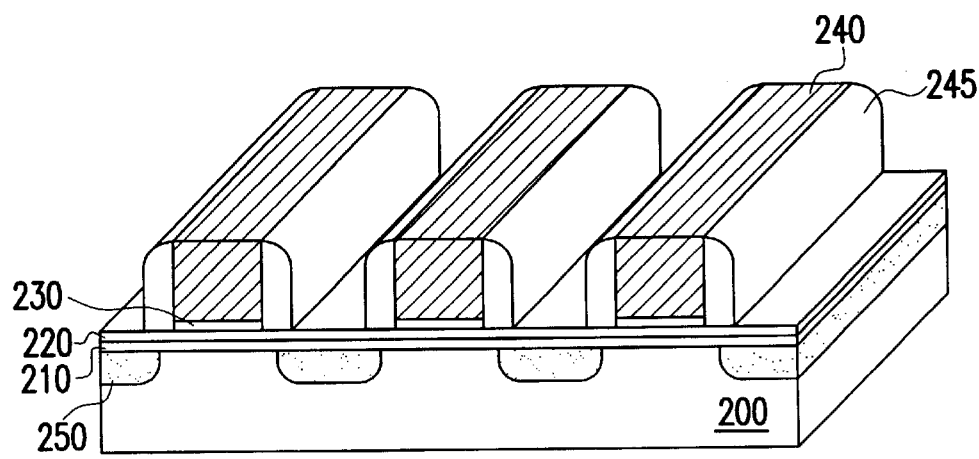

Referring to FIG. 2C, the sacrificial spacers 241 are removed, so is the silicon oxide layer 230 exposed by the bar-like conductive layers 240. Next, a plurality of high-K spacers 245 are formed on the side-walls of the bar-like conductive layers 240. The material of the high-K spacer 245 must have a dielectric constant large enough to allow the channel to extend to the substrate under the high-K spacer 245 as this SONOS memory is operated. Thus, the dielectric constant of the material of the high-K spacers 245 is preferably larger than 30, and such a material is, for example, $Ta_2O_5$.

Referring to FIG. 2C again, the width of one high-K spacer 245 is substantially equal to that of one sacrificial spacer 241, thus the buried bit-line 250 also extends into the substrate 200 under a portion of an adjacent high-K spacer 245, but not to the substrate 200 under an adjacent bar-like conductive layer 240.

In addition, a sacrificial spacer having a width less than that of the high-K spacer 245 can also be used in this preferable embodiment, where the buried bit-lines 250 are formed by performing a vertical ion implantation by using the narrower sacrificial spacers as a mask. Thus, the buried bit-line can extend into the substrate 200 under a portion of an adjacent high-K spacer 245, but not to the substrate 200 under an adjacent bar-like conductive layer 240.

Figure 2D:
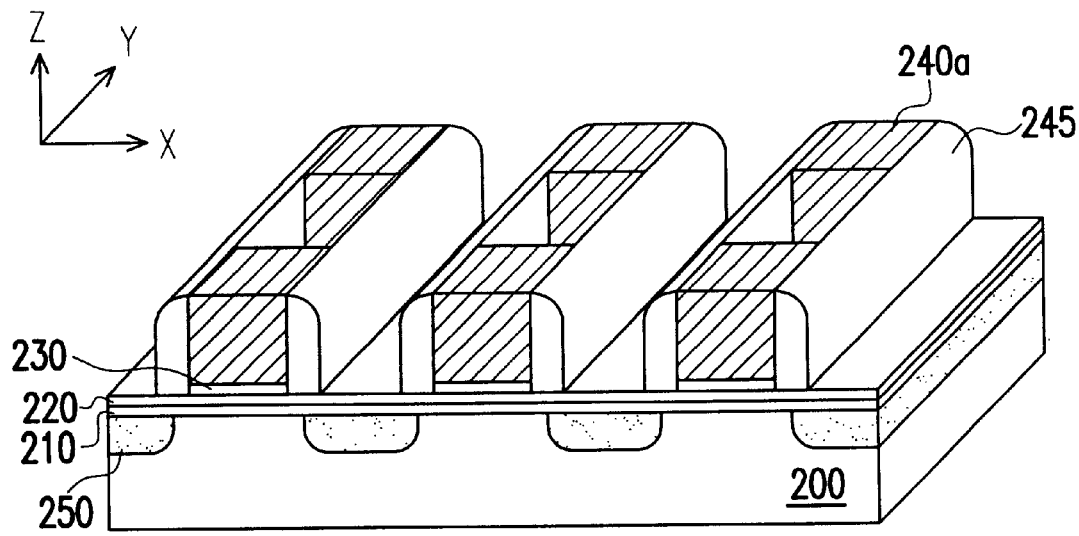

Referring to FIG. 2D, the bar-like conductive layers 240 are patterned into an array of gates 240a, where each of the bar-like conductive layers 240 is divided in the Y-direction of FIG. 2D.

Figure 2E:
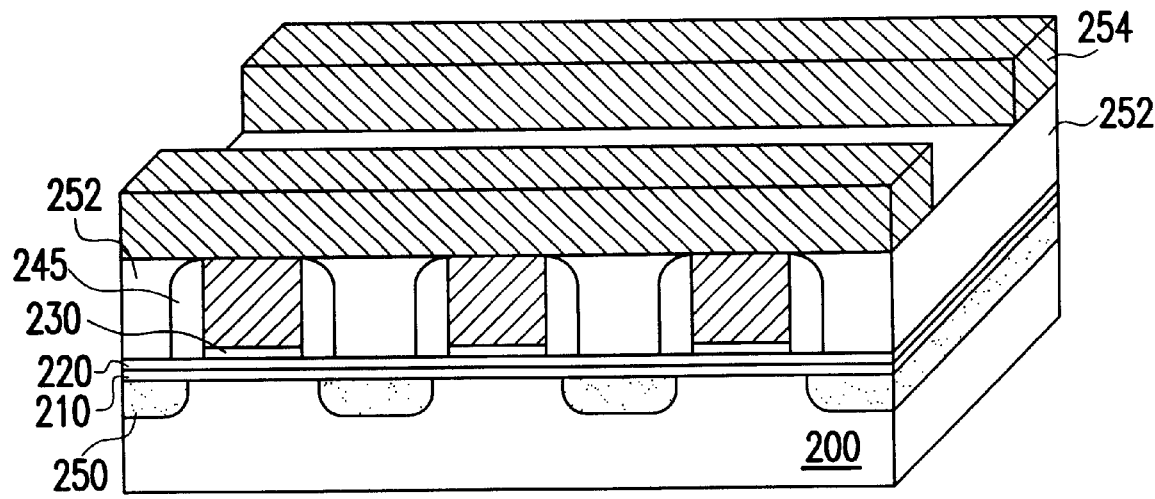

Referring to FIG. 2E, a dielectric material 252, such silicon oxide, is used to fill the gaps between the gates 240a and between the high-K spacers 245, which is achieved by, for example, chemical vapor deposition and a following chemical mechanical polishing (CMP). After that, word-lines 254 are formed over the substrate 200, each of which electrically connects with the gates 240a of the same row and crosses over the buried bit-lines 250.

Besides, the dielectric material can also be filled into the gaps between the high-K spacers 245 before the gates 240a are defined (referring to FIG. 2C) in this preferable embodiment. In such a case, a conductive layer is then formed on the bar-like conductive layers 240 and the dielectric material, and the conductive layer is patterned into the word-lines 254 crossing over the bit-lines 250. After that, the patterning process is continued to pattern the bar-like conductive layers 240 into the gates 240a that are self-aligned to the word-lines 254.

Figure 1:
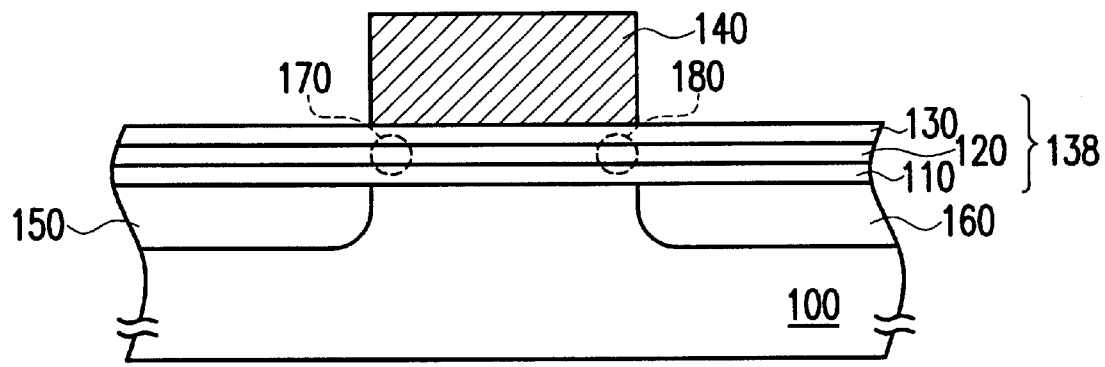
FIG. 1 illustrates the structure of the conventional SONOS memory cell and the positions of the data storage regions in the conventional SONOS memory cell.
Figure 3:
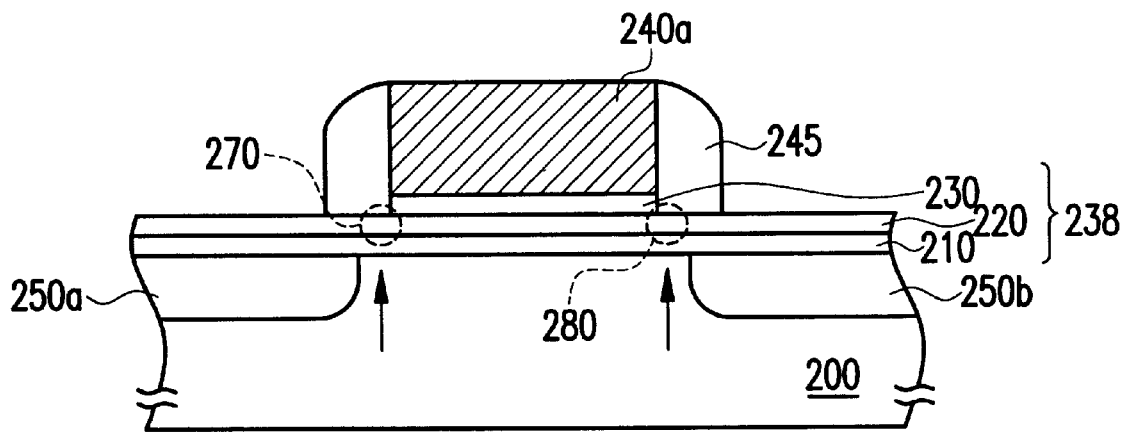
FIG. 3 illustrates the structure of the single SONOS memory cell and the positions of the data storage regions in this SONOS memory cell according to one preferred embodiment of this invention.

FIG. 3 illustrates the structure of a single SONOS memory cell and the positions of the data storage regions in this SONOS memory cell according to one preferred embodiment of the present invention. As shown in FIG. 3, since there is a high-K spacer 245 formed on the side-wall of the gate 240a in this invention, the channel can extend to the substrate 200 under the high-K spacer 245 and connect with the buried bit-line 250a and 250b when a voltage is applied to the gate. Therefore, for example, when the channel hot electron (CHE) injection mechanism is used to program the memory device, the electrons moving in the channel can be injected into the silicon nitride layer 220 near the buried bit-line 250a or 250b, where the electric field is strongest. That is, the electrons are stored in the data storage region 270/280 within silicon nitride layer 220 under the high-K spacer 245. Thus, the distance between the two data storage regions 270 & 280 in the silicon nitride layer 220 increases, and the interference between them decreases. Moreover, since the distance between the two data storage regions 270 & 280 can be increased by the method of this invention, a smaller memory cell is also feasible, i.e., it is easier to scale down the size of the memory cell (gate linewidth).

In addition, the sacrificial spacers 241 and the bar-like conductive layers 240 are used as the mask during the implantation of the buried bit-lines 250 and the high-K spacers 245 are formed after the implantation and the annealing of the buried bit-lines 250 in this embodiment. Therefore, the high-K spacers 245 will not be damaged by the high temperature in the annealing step of the buried bit-lines 250.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method of fabricating a non-volatile memory, comprising the steps of:

providing a substrate;

forming a charge-trapping layer on the substrate;

forming a plurality of bar-like conductive layers on the charge-trapping layer;

forming a plurality of buried bit-lines in the substrate between the bar-like conductive layers;

forming a plurality of high-K spacers on the side-walls of the bar-like conductive layers;

forming a plurality of gates on the bar-like conductive layers; and forming a plurality of word-lines over the substrate to electrically connect with the gates, wherein
   each of the buried bit-lines extends into the substrate under a portion of an adjacent high-K spacer, but not to the substrate under an adjacent bar-like conductive layer; and
   a material of the high-K spacer has a dielectric constant and the high-K spacer has a width, such that a channel will extend to the substrate under the high-K spacer and connect with the buried bit-line when the non-volatile memory is operated.

2. The method of claim 1, wherein the dielectric constant is substantially larger than 30.

3. The method of claim 1, wherein each of the buried bit-lines extends into the substrate under a portion of an adjacent high-K spacer, but not to the substrate under an adjacent bar-like conductive layer.

4. The method of claim 1, wherein the charge-trapping layer comprises, from bottom to top, a first silicon oxide layer, a silicon nitride layer, and a second silicon oxide layer.

5. The method of claim 1, wherein the method of forming the buried bit-lines comprises the steps of:
   forming a plurality of sacrificial spacers on the side-walls of the bar-like conductive layers;
   performing an ion implantation to form the buried bit-lines by using the bar-like conductive layers and the sacrificial spacers as a mask; and
   removing the sacrificial spacers.

6. The method of claim 5, further comprising removing the second silicon oxide layer exposed by the bar-like conductive layers while removing the sacrificial spacers, and
   wherein the charge-trapping layer comprises, from bottom to top, a first silicon oxide layer, a silicon nitride layer, and a second silicon oxide layer.

7. The method of claim 5, wherein the sacrificial spacers are made of silicon oxide or silicon nitride.

8. The method of claim 5, wherein a width of each sacrificial spacer is less than that of each high-K spacer, and the ion implantation is a vertical ion implantation.

9. The method of claim 5, wherein a width of each sacrificial spacer is substantially the same as that of each high-K spacer; and the ion implantation is a tilt ion implantation.

10. The method of claim 1, wherein a material of the high-K spacers comprises $Ta_2O_5$.

11. The method of claim 1, wherein the method the forming the gates and the word-lines comprises the steps of:
   patterning the bar-like conductive layer into the gates;
   filling a plurality of gaps between the gates and between the high-K spacers with a dielectric material; and
   forming the word-lines electrically connecting with the gates over the substrate.

12. The method of claim 1, wherein the method of forming the gates and the word-lines comprises the steps of:
   filling a plurality of gaps between the high-K spacers with a dielectric material;
   forming a conductive layer on the bar-like conductive layers and the dielectric material; and
   patterning the conductive layer into the word-lines and successively patterning the bar-like conductive layers into the gates.

13. A method of fabricating a non-volatile memory, comprising the steps of:
   providing a substrate;
   forming a charge-trapping layer on the substrate, wherein the charge-trapping layer comprises, from bottom to top, a first silicon oxide layer, a silicon nitride layer, and a second silicon oxide layer;
   forming a plurality of bar-like conductive layers on the second silicon oxide layer;
   forming a plurality of sacrificial spacers on the side-walls of the bar-like conductive layers;
   performing an ion implantation to form a plurality of buried bit-lines in the substrate between the bar-like conductive layers by using the bar-like conductive layers and the sacrificial spacers as a mask;
   removing the sacrificial spacers;
   forming a plurality of high-K spacers on the side-walls of the bar-like conductive layers;
   forming a plurality of gates on the bar-like conductive layers;
   filling a plurality of gaps between the gates and between the high-K spacers with a dielectric material; and
   forming a plurality of word-lines electrically connecting with the gates over the substrate, wherein
      a material of the high-K spacer has a dielectric constant and the high-K spacer has a width, such that a channel will extend to the substrate under the high-K spacer and connect with the buried bit-line when the non-volatile memory is operated.

14. The method of claim 13, wherein the dielectric constant is substantially larger than 30.

15. The method of claim 13, wherein each of the buried bit-lines extends into the substrate under a portion of an adjacent high-K spacer, but not to the substrate under an adjacent bar-like conductive layer.

16. The method of claim 13, wherein
   a width of each sacrificial spacer is less than that of each high-K spacer; and
   the ion implantation is a vertical ion implantation.

17. The method of claim 13, wherein
   a width of each sacrificial spacer is substantially the same as that of each high-K spacer; and
   the ion implantation is a tilt ion implantation.

18. The method of claim 13, wherein the material of the sacrificial spacers is silicon oxide, and the second silicon oxide layer exposed by the bar-like conductive layers is also removed in the step of removing the sacrificial spacers.

19. The method of claim 1, further comprising performing an annealing step after forming a plurality of buried bit-lines in the substrate between the bar-like conductive layers.

20. The method of claim 13, further comprising performing an annealing step after forming a plurality of buried bit-lines in the substrate between the bar-like conductive layers.

* * * * *